United States Patent

Buckley et al.

[11] Patent Number: 5,938,999
[45] Date of Patent: Aug. 17, 1999

[54] WET-SPINNING FIBER PROCESS PROVIDING CONTROLLED MORPHOLOGY OF THE WET-SPUN FIBER

[75] Inventors: Leonard J. Buckley, Fairfax Station; Mark Eashoo, Stafford, both of Va.

[73] Assignee: The United States of America as represented by the Secretary of the Navy, Washington, D.C.

[21] Appl. No.: 08/800,328

[22] Filed: Feb. 14, 1997

[51] Int. Cl.⁶ .................................. D01F 6/12; D01F 6/74

[52] U.S. Cl. ...................... 264/184; 264/178 F; 264/203

[58] Field of Search .................................... 264/184, 203, 264/178 F

[56] References Cited

U.S. PATENT DOCUMENTS

| | | | |
|---|---|---|---|
| 4,826,927 | 5/1989 | Schmid et al. | 525/422 |
| 5,151,227 | 9/1992 | Nguyen et al. | 264/184 |
| 5,216,173 | 6/1993 | Stephens et al. | 548/429 |
| 5,367,046 | 11/1994 | Dorogy, Jr. et al. | 264/184 |
| 5,378,420 | 1/1995 | Harris et al. | 264/184 |
| 5,716,567 | 2/1998 | Musina et al. | 264/184 |
| 5,795,920 | 8/1998 | Kang et al. | 521/64 |

*Primary Examiner*—Robert Davis
*Attorney, Agent, or Firm*—Thomas E. McDonnell; George A. Kap

[57] ABSTRACT

A wet-spinning fiber process which controls the microstructure of the wet-spun fiber by varying the non-solvent/solvent miscibility and precipitation strength.

7 Claims, No Drawings

WET-SPINNING FIBER PROCESS PROVIDING CONTROLLED MORPHOLOGY OF THE WET-SPUN FIBER

BACKGROUND OF THE INVENTION

1. Field of the Invention

The purpose of this invention is to form wet-spun fibers by varying the rate of polymer coagulation through adjustments in non-solvent/solvent miscibility and precipitation strength to control internal morphology of the wet-spun fibers.

2. Description of the Related Art

As the microelectronics industry moves toward higher rates of data transmission, laminate materials with enhanced dielectric properties will be needed for high-speed multilayer printed wiring boards (PWB's). Since composites are highly filled with reinforcing materials, fibers will play a significant role in lowering the overall dielectric constant of PWB's.

The development of polyimides possessing high solubility, optical transparency in the visible spectrum, and low dielectric constants has been studied.

One such polyimide, known as poly(6FDA-4BDAF), has been made from 2,2-bis (3,4-dicarboxyphenyl) hexafluoropropane dianydride (6FDA) and 2,2-bis [4-(4-aminophenoxy) phenyl]hexafluoropropane (4BDAF), and has the following formula:

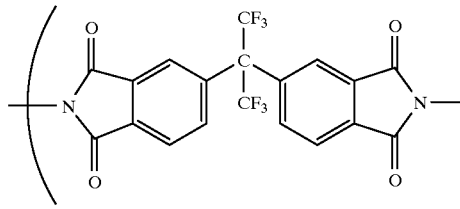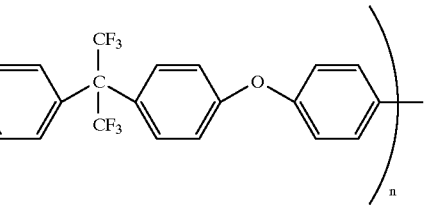

This polymer has a dielectric constant of 2.5 at 10 GHz.

However, the above-identified polymer has had little success in the area of fiber spinning. More specifically, fibers spun from the 6FDA-4BDAF polymer were reported as non-circular and containing large voids and/or a sponge-like texture that remained through heat treatment resulting in weak filaments. Therefore, successful production of solid core filaments from this polymer has not been achieved by these past attempts. Also, the resulting filaments exhibited low moduli (5GPa) and tenacity (0.2GPa).

Accordingly, there is a need for a process which enables control of fiber microstructure, enabling production of fibers having a tailored microstructure, including a solid core microstructure.

It is therefore an object of the present invention to provide a process that can control fiber morphology by varying the rate of polymer coagulation through adjustments in non-solvent/solvent miscibility and precipitation strength.

It is another object of the present invention to provide a process whereby the solvent utilized for spinning the fiber is selected based upon polymer solubility and solvent/coagulant miscibility such that the rate of coagulation can be controlled.

It is another object of the present invention to provide a process utilizing a solvent that is miscible in only one of the agents of the coagulating bath such that, by varying the ratio of the binary solution in the coagulation bath, greater control of the fiber structure is achieved by limiting the rate of coagulation.

SUMMARY OF THE INVENTION

The present invention employs a fluorinated PI (polyimide) in a wet-spinning fiber process. The fluorinated PI was chosen because of its desirable properties for electronic applications, and the present invention is not limited to this type of fiber.

The solvent used for spinning of the fiber (the solvent in the spinning dope) requires a material which can form solutions with the polyimide. Examples include ethyl acetate, methylene chloride, and dimethylacetamide (DMAc). These solvents were chosen to reflect a large range of both solubility parameters and miscibility with water.

For the coagulation bath utilized in the wet-spinning process of the present invention, the coagulation baths range from 100% coagulant to 40% water which is equivalent to a mole fraction range between 1.0 and 0.2-0.3, with the lower limit dependent upon the non-solvent used. The coagulant chosen was ethanol or methanol.

The advantage of the present invention is that the internal morphology of the wet-spun fibers can be controlled by varying the rate of polymer coagulation through adjustments in non-solvent/solvent miscibility and precipitation strength of the coagulation bath.

DETAILED DESCRIPTION OF THE PREFERRED EMBODIMENTS

The present invention is a process that controls the internal morphology of wet-spun fibers from a polyimide by varying the rate of polymer coagulation through adjustments in the non-solvent/solvent miscibility and precipitation strength.

Resultant filament morphologies range from very porous or spongy to fully solid. Intermediate structures include fibers containing a spongy core with a non-porous skin, spongy fibers containing large voids, and a relatively solid material containing randomly spaced small voids.

As the polymer used for spinning the fiber, a poly(6FDA-4BDAF) prepared by NASA-Langley Research Center (Hampton, VA) was chosen because of its desirable low dielectric constant. This polymer has been reported to have an inherent viscosity of 1.55 dL/g. Various solvents and coagulants were purchased and used as received from either Fisher Scientific or Aldrich.

Materials which form solutions with poly(6FDA-4BDAF) were then selected as the solvent for spinning the fiber. Ethyl acetate (Ea), methylene chloride (Mc), and dimethylacetamide (DMAc) were chosen as solvents for spinning the fiber in the present invention. This choice of solvents was made to reflect a large range of both solubility parameters with the polymer and miscibility with water, and is not meant as a limitation on the present invention.

The miscibility of each solvent used for spinning varied in relation to the coagulants. DMAc is completely miscible with water and other suitable solvents such as acetic acid and alcohols. Ethyl acetate and methylene chloride are immiscible in water, but are miscible in water solutions containing either acetic acid or alcohol.

The coagulation baths ranged from 100% coagulant to 40% water. In all cases, the lower limit of 40% water is near the two phase boundary. The coagulant utilized was methanol or ethanol.

As shown in Table I the spinning solvents utilized in the process of the present invention are dimethylacetamide (DMAc), ethyl acetate (Ea), and methylene chloride (Mc).

For the coagulant bath, either a mixture of methanol (M) and water or a mixture of ethanol (E) and water was used. The amount of water in the coagulation bath ranged from 0% to 40%.

TABLE I

Poly(6FDA-4BDAF) Fiber and Related Spinning Characteristics

| Sample* | Gel-Zone Length (cm) | Color | Cross-Sectional Area | Cross-Sectional Shape ($\mu M^2$) | Internal Structure |
|---|---|---|---|---|---|
| High precipitation strength: | | | | | |
| M-100-D | 2–3 | white | 3,240 | thick dog-bone | small voids with sponge texture |
| M-95-D | 2–3 | white | 3,720 | oval | small void with sponge texture |
| M-95-Ea | <1 | white | 1,420 | oval | sponge texture |
| M-95-Mc | 10–12 | yellow | 1,180 | | solid skin with thin sponge core |
| M-60-D | <1 | yellow-white | 2,600 | thin dog-bone | large voids with sponge texture |
| Low precipitation strength: | | | | | |
| E-100-Mc | >15 | transparent yellow | 830 | C-shaped | solid skin with thin sponge core |
| E-100-Ea | 2–3 | white | 1,600 | oval | sponge texture |
| E-100-D | 8–10 | white | 3,460 | circular | large voids with sponge texture |
| E-95-Mc | 10–15 | transparent yellow | 1,160 | C-shaped | solid |
| E-60-Mc | 8–10 | yellow | 1,270 | oval | solid with small voids |
| E-60-D | <1 | white | 2,640 | thin dog-bone | large voids with sponge texture |

*Sample notation follows a "coagulant – % coagulant – solvent" scheme.
D = DMAc, E = ethanol, Ea = ethyl acetate, M = methanol, Mc = methylene chloride A modified Bradford University Research Limited wet-spinning line was used in conjunction with a type SD/50 single hole spinneret of 100 μm diameter for fiber production.

A 4-L coagulation bath and a water filled wash bath were fitted with individual circulating cooling/heating units for temperature control.

Each of the spinning dopes had a 14.5% (w/w) polymer concentration. All dopes were degassed by centrifuging and filtered immediately before spinning.

The spinning dopes, at 20° C, were extruded beneath the surface of a binary coagulation bath (10° C). Filaments exited the coagulation bath via rollers and were fed into a 30° C wash bath.

After washing, filaments were collected on a take-up spool and dried under vacuum at 80° C for 14 hours.

A no-stretch condition was used between the cluster rollers and take-up winder. Minimal stretching in the coagulation bath was achieved by using the slowest roller speeds (4.5 m/min) and extrusion rate (0.041 cm$^3$/min) for a stable and continuous spin line. Under these conditions, a low gel stretch of about 1.2x overall was obtained. The fibers were later zone-drawn, by direct contact over a hot-pin at constant stress and speed.

Table I below lists the different spinning solvents and coagulant baths utilized in the process of the present invention.

Within each of the series shown in Table I above, the precipitation strength varies by coagulant choice and water content of the coagulation bath.

Precipitation strengths were determined using UV-Vis spectroscopy to detect the scattering power of partially precipitated polymer solutions, where the magnitude of the absorbance between 600 nm and the cutoff wavelength was used to assign a relative ranking of precipitation strength for the coagulants. A high value for absorbance indicated a more precipitated solution. Each series in Table I is therefore grouped according to this evaluation.

With respect to degree of miscibility, high miscibility systems include DMAc, moderate miscibility systems include ethyl acetate, and low miscibility systems include methylene chloride.

Extrusion of each of the spinning dopes in Table I into the coagulant bath formed filaments at varying precipitation rates. This is indicated by the length of the gel zone. The gel zone is the distance between the point at which the spinning dope enters the coagulant bath and the point at which precipitation occurs, i.e., the point at which color is observed as listed in Table I. By varying the ratio of water and coagulant in the coagulation bath, the length of the gel zone can be altered.

Table I also describes the internal structure (morphology) of the resultant wet-spun fiber from each series. The series in Table I of Samples E-100-Mc, E-95-Mc and E-60-Mc, illustrates that by changing the type of coagulation bath, (100% ethanol, 95% ethanol, and 60% ethanol), porosity can be altered according to the process of the present invention. The series in Table I of Samples E-100Mc, E-100-Ea and E-100-D shows that porosity can also be controlled by the choice of solvent used for spinning the fiber.

The present invention allows control of the morphology of wet-spun fibers. By tailoring the non-solvent/solvent miscibility and precipitation strength of the coagulation bath, the rate of polymer is coagulation and therefore control over the internal microstructure of wet-spun fibers has been achieved.

As a result, a wide variety of morphologies ranging from sponge-like to fully solid has been obtained. Intermediate structures including fibers containing a spongy core with a non-porous skin, sponge-like fibers containing large voids, and a relatively solid material containing randomly spaced small voids have been obtained.

The ability to tailor the porosity of fibers provides a potential advantage in forming wet-spun fibers having desirable properties such as a lower dielectric constant for applications such as laminate materials with enhanced dielectric properties.

Various modes of carrying out the invention will be evident to those skilled in the art without departing from the spirit and scope of the present invention as defined in the claims.

We claim:

1. In a wet-spinning fiber process comprising the steps of extruding a fluorinated polyimide polymer solution into a coagulant and forming fibers having dielectric constant of less than 3, the improvement pertains to controlling fiber morphology of the wet-spun fibers from solid to porous in a system of a solvent for the polymer and a coagulant; the coagulant comprises plural agents; the solvent is miscible with only one of the agents said process comprising the step of adjusting rate of polymer coagulation through adjustment of water/solvent miscibility and precipitation strength of coagulation bath whereby an increase in amount of water yields increased porosity of the fiber.

2. The process of claim 1 wherein the polymer is poly (6FDA-4BDAF), the fibers that are made from the polymer have dielectric constant of less than about 2.5, and high precipitation strength is characterized by the presence of methanol in the coagulant.

3. The process of claim 2 including the step of increasing amount of water to lengthen gel-zone.

4. The process of claim 2 wherein the coagulant is a mixture of ethanol and up to 40% water; wherein the solvent is methylene chloride; and wherein morphology of the fiber is from all solid to solid with spongy core.

5. The process of claim 2 wherein the coagulant is a mixture of methanol and about 5% by volume water; wherein the solvent is ethyl acetate; and wherein fiber morphology is sponge texture.

6. The process of claim 2 wherein the coagulant is a mixture of methanol and about 5% by volume water; wherein the solvent is methylene chloride; and wherein fiber morphology is solid skin with thin sponge texture.

7. The process of claim 2 wherein the coagulant is ethanol; wherein the solvent is ethyl acetate; and wherein fiber morphology is sponge texture.

* * * * *